United States Patent
Sandhu

(10) Patent No.: US 9,607,725 B2
(45) Date of Patent: Mar. 28, 2017

(54) GRAPHENE STRUCTURE, METHOD FOR PRODUCING THE SAME, ELECTRONIC DEVICE ELEMENT AND ELECTRONIC DEVICE

(75) Inventor: Adarsh Sandhu, Yokohama (JP)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 1155 days.

(21) Appl. No.: 12/643,434

(22) Filed: Dec. 21, 2009

(65) Prior Publication Data

US 2011/0143101 A1     Jun. 16, 2011

(30) Foreign Application Priority Data

Dec. 11, 2009   (JP) .................. 2009-281897

(51) Int. Cl.
*B05D 3/10* (2006.01)
*B05D 1/36* (2006.01)
(Continued)

(52) U.S. Cl.
CPC ............. *H01B 1/04* (2013.01); *B82Y 30/00* (2013.01); *B82Y 40/00* (2013.01);
(Continued)

(58) Field of Classification Search
USPC .................................................. 428/195.1
See application file for complete search history.

(56) References Cited

U.S. PATENT DOCUMENTS

2009/0029221 A1 * 1/2009 Goddard et al. ................ 429/30

FOREIGN PATENT DOCUMENTS

JP   2007-335532   12/2007
JP   2009-143761    7/2009
(Continued)

OTHER PUBLICATIONS

Gomez-Navarro, "Electronic Transport Properties of Individual Chemically Reduced Graphene Oxide Sheets," Nano Letters 2007, vol. 7 No. 11 p. 3499-3503.*
Liu et al., "Controlled deposition of individual single-walled carbon nanotubes on chemically functionalized templates," Chemical Physics Letters, 1999, 303, p. 125-129.*

(Continued)

*Primary Examiner* — Ian Rummel
(74) *Attorney, Agent, or Firm* — Maschoff Brennan

(57) ABSTRACT

Provided are a graphene structure and a method for producing the same in which graphene can be patterned with high precision, and thereby microfabrication of electronic device elements and electronic devices using graphene is possible and the manufacturing cost can be notably reduced. A resist film is precisely patterned on a substrate, hydrophilized films are formed in openings of the resist film, and then GO is selectively fixed on the portions of the hydrophilized films by a chemical bond utilizing the hydrophilicity of the GO, and the GO is reduced to obtain a graphene structure in which graphene is selectively fixed to only the portions of the hydrophilized films. Thus, the graphene structure is constituted by disposing graphene on a substrate and forming a bond, by hydrophilization treatment, between the hydrophilized portion of the substrate and the graphene and/or between the unhydrophobized portion of the substrate and the graphene.

8 Claims, 5 Drawing Sheets

(51) Int. Cl.
- *B32B 3/10* (2006.01)
- *B32B 9/00* (2006.01)
- *B05D 5/12* (2006.01)
- *B05D 3/04* (2006.01)
- *B05D 5/00* (2006.01)
- *H01B 1/04* (2006.01)
- *B82Y 30/00* (2011.01)
- *B82Y 40/00* (2011.01)
- *C01B 31/04* (2006.01)
- *H01L 31/0224* (2006.01)
- *H01L 31/18* (2006.01)

(52) U.S. Cl.
CPC ...... *C01B 31/0446* (2013.01); *C01B 31/0476* (2013.01); *H01L 31/022466* (2013.01); *H01L 31/1884* (2013.01); *Y02E 10/50* (2013.01); *Y10T 428/24802* (2015.01); *Y10T 428/30* (2015.01)

(56) References Cited

FOREIGN PATENT DOCUMENTS

| | | |
|---|---|---|
| JP | 2009-143799 | 7/2009 |
| JP | 2009-200177 | 9/2009 |

OTHER PUBLICATIONS

"Single-electron transistors made by chemical patterning of silicon dioxide substrates and selective deposition of gold nanoparticles," Coskun et al., 2008, Applied Physics Letters, vol. 93, p. 123101.*

"Tribology Study of Reduced Graphene Oxide Sheets on Silicon Substrate Synthesized via Covalent Assembly," Ou et al., 2010, Langmuir, p. 15830-15836.*

"n-Type Behavior of Graphene Supported on Si/SiO2 Substrates," Romero et al., 2008, ACSNano, vol. 2, No. 10, p. 2037-2044.*

"Oxide growth on silicon (100) in the plasma phase of dry oxygen using an electron cyclotron resonance source," Kim et al., 1996, Journal of the American Vacuum Society B, vol. 14, issue 4, p. 2667.*

"Electronic Transport Properties of Individual Chemically Reduced Graphene Oxide Sheets," Gomez-Navarro et al., 2007, Nano Letter, vol. 7, No. 11, p. 3499-3503.*

"Principles of Lithography," Levinson, 2005, p. 57.*

Kim, S.K. et al., "Large-scale pattern growth of graphene films for stretchable transparent electrodes," Nature, vol. 457, pp. 706-710, Feb. 5, 2009.

Zhang, Y., et al., "Direct observation of a widely tunable bandgap in bilayer graphene," Nature, vol. 459, pp. 820-823, Jun. 11, 2009.

Tung, V. C., et al., "High-throughput solution processing of large-scale graphene," Nature Nanotech, vol. 4, pp. 25-29 (2009).

* cited by examiner

GRAPHENE STRUCTURE, METHOD FOR PRODUCING THE SAME, ELECTRONIC DEVICE ELEMENT AND ELECTRONIC DEVICE

CROSS-REFERENCE TO RELATED APPLICATION

This application claims the benefit of Japanese Application No. 2009-281897 filed on Dec. 11, 2009 which is incorporated herein by reference.

BACKGROUND

Technical Field

The present disclosure relates to a graphene structure, a method for producing the same, a graphene electrode, an electronic device element (including a single element of an electronic part (component)), and an electronic device.

Related Art

Graphene, which composes a basic unit structure of graphite, allotropes such as carbon nanotube and carbon fullerene, other carbonaceous materials, and the like, is a single layer with a thickness of just one atom exfoliated from a layered structure of graphite, in other words, graphene has a hexagonal grid structure continuously formed by sp2-bonded carbon atoms in a sheet-like shape having a thickness of one atom. Thus, graphene consists of a single layer of carbon atoms and has a significantly thin thickness. Therefore, there is a possibility that a transparent conductive path can be formed by using graphene. Furthermore, in graphene, the mobility of holes is substantially the same as that of electrons. Consequently, graphene has both properties of a metal and a semiconductor. Accordingly, graphene is expected to be applied to a variety of purposes as, for example, various types of electronic device elements, such as a conductive film (layer) or a transparent electrode, in various electronic devices, such as a high-performance transistor or a solar cell.

Methods for producing graphene are described in, for example, patent documents 1 to 3. In general, graphene can be formed from available graphite by mechanically or chemically exfoliating the layered structure into single layers (for example, flake-like layers).

Patent document 1: Japanese Unexamined Patent Application Publication No. 2007-335532

Patent document 2: Japanese Unexamined Patent Application Publication No. 2009-200177

Patent document 3: Japanese Unexamined Patent Application Publication No. 2009-143761.

SUMMARY

In order to apply graphene to electronic devices for various purposes as described above, for example, the flake-like graphene (fragments) must be patterned with high precision according to the purpose. However, it is significantly difficult to actually fix an intended amount of graphene at an intended position on a predetermined substrate, and it is a current state that the fixation of graphene is obliged to be performed by a follow-up method in which graphene flakes are fixed at unspecified positions on an adequate substrate, and then portions where the graphene flakes are resultantly arranged and fixed so as to be adequate in size, shape, and pattern are selected and applied to fabrication. Since the patterning of graphene cannot be intentionally controlled, there is also a problem of increasing manufacturing cost.

Accordingly, it is desired to be able to pattern graphene with high precision, which can provide a graphene structure that allows micro-fabrication of electronic device elements (including single elements of electronic parts) employing graphene, such as an electrode, and various electronic devices including the electronic devices and also can notably decrease the manufacturing cost, and it is desired to provide such a graphene structure, a method for producing the graphene structure, a graphene electrode, an electronic device element, and an electronic device.

In order to solve the above-mentioned problems, in the graphene structure according to the present disclosure, graphene is disposed to (on) a substrate, and a bond is formed between a hydrophilized (with hydrophilization treatment) portion of the substrate and the graphene or between an unhydrophobized (without hydrophobization treatment) portion of the substrate and the graphene. The shape of the "substrate" is not limited to plate-like ones, and any shaped base substrate to which graphene can be fixed can be used.

In usual, for example, a part of carbon atoms of a flake-like graphene fragment is oxidized or is modified with various functional groups having hydrophilicity, such as a hydroxyl group or a carboxyl group. According to the finding by the present inventor, in particular, most of these functional groups are bonded to carbon atoms on the outermost periphery (edge portion) of a graphene flake. Furthermore, the hydrophilicity of the graphene (flake) itself can be expressed due to the chemical properties of these functional groups. Therefore, as described above, if the hydrophilization treatment is applied between a substrate to which graphene is disposed (fixed) and the graphene (for example, on the surface of the substrate), the bond between them is strengthened.

On the other hand, when the substrate is hydrophobized, the hydrophobized portion of the substrate is low in wettability (has a large contact angle) to a graphene-dispersing aqueous solution described below to shed the dispersion aqueous solution, and/or, as described above, since the graphene (flake) itself can have hydrophilicity, the graphene tends to easily have affinity with an unhydrophobized portion of the substrate. In this case, if the substrate or a surface thereof is provided with an oxide (layer or film), such as a $Si/SiO_2$ substrate, or the substrate is a common semiconductor substrate, such as a Si semiconductor substrate, the surface is provided with, for example, a hydroxyl group under undried conditions and thereby has high wettability (has a small contact angle) to allow the graphene-dispersing aqueous solution to readily diffuse and easily form a chemical bond with the functional group having hydrophilicity formed in the graphene.

Furthermore, according to the finding of the present inventors, in the cases of (1) applying only hydrophilization treatment to a predetermined portion of a substrate, (2) applying only hydrophobization treatment to a predetermined portion of a substrate, and (3) applying hydrophilization treatment to a predetermined portion of a substrate and applying hydrophobization treatment to another predetermined portion of the substrate, it has been confirmed that the selectivity for bonding and fixing graphene to a hydrophilized portion of a substrate or to an unhydrophobized portion of a substrate is increased in the order (1)<(2)<(3). That is, among the cases (1) to (3), the case (3) allows graphene to be easily fixed most selectively to an intended portion (the hydrophilized portion of a substrate).

As the hydrophilization treatment, a bond with a functional group formed in graphene, such as a hydroxyl group or a carboxyl group, can be used; and also as the hydrophobization treatment, a common water-repellent treatment can be used. Therefore, in both treatments, generally known methods can be adequately applied. Since the hydrophilized and/or unhydrophobized portion can be patterned with high precision, graphene can be selectively fixed to the portion patterned with high precision. As a result, the patterning of graphene on a substrate can be achieved with high precision and at low cost.

Furthermore, conventionally, not only that graphene is difficult to be patterned with high precision on a substrate (difficult control), but also that the graphene cannot be fixed to an intended portion. Consequently, it has been difficult to enlarge the size of a graphene film, that is, it has been difficult to sufficiently increase the domain size (size of a continuous film) of graphene. However, the above-described hydrophilization treatment can also be easily applied to a large area on a substrate. Therefore, (a pattern of) a large-area graphene film having a large domain size can be easily formed. In addition, since a substrate and graphene are bonded and fixed (tightly, in particular, when the substrate is hydrophilized), the treatment for patterning the graphene on the substrate is not required to be conducted at a high temperature, in other words, the patterning of the graphene can be performed at low temperature. This also increases manufacturing efficiency and economic efficiency and can suppress the quantity of heat input to the substrate and the graphene, which prevents the graphene structure from being degraded, resulting in an increase in reliability of the structure.

In addition, the "bond" between the substrate and the graphene may be a bond between a first functional group formed on the substrate and a second functional group formed (bonded) to the graphene.

In this event, when the first functional group of the substrate is an electron acceptor functional group and the second functional group of the graphene is an electron donor functional group or, conversely, when the first functional group of the substrate is an electron donor functional group and the second functional group of the graphene is an electron acceptor functional group, the substrate and the graphene tend to easily form a "bond".

The electron acceptor functional group is not particularly limited, but examples thereof include a group having a nitrogen atom, and also the electron donor functional group is not particularly limited, but examples thereof include a hydroxyl group, a carboxyl group, a carbonyl group, and a sulfo group.

Furthermore, an example of the group having a nitrogen atom may be an amino group.

When the substrate is, for example, a Si substrate (having a surface on which a natural oxide film of, for example, SiO or $SiO_2$, can be easily formed or having a surface with such a film) or a substrate having a surface on which a silane bond can be formed, such as other oxide substrates, the first functional group may be a group bonded to the substrate via a molecular chain containing the silane bond. In such a case, a hydrophilization treatment agent containing the first functional group in the molecule, for example, a silane coupling compound, a self-assembly monomolecule capable of forming a self-assembled monolayer (SAM), or a reagent containing a polymer compound that contain the first functional group in the molecule, may be applied and fixed on a surface of the substrate. Alternatively, without forming a silane bond on the substrate, for example, the substrate may be plasma-treated with oxygen ($O_2$) plasma to form the first functional group (for example, a hydroxyl group or other chemically active species).

When the substrate has a metal atom on a surface and has a bond between a group containing a sulfur atom and the metal atom on the surface, the first functional group may be bonded to the substrate via a molecular chain containing the bond between the group containing a sulfur atom and the metal atom. In such a case, the body of the substrate may be made of various materials, for example, Si, $SiO_2$, $SiO_2$/Si, sapphire, GaAs, or a metal conductor such as stainless steel, or an insulator, such as glass or ceramics, and if the substrate has a film, on a surface, of a metal, such as gold, silver, copper, platinum, palladium, or mercury, or a film containing such a metal, an agent for forming a self-assembled monolayer (SAM) containing a group having a sulfur atom, such as a thiol group, a sulfide group, or a disulfide group, in a molecule and also containing the first functional group in the same molecule may be applied to the surface of the substrate having the metal film.

From the above, the graphene structure according to the present disclosure may be represented by that graphene is disposed to (on) a substrate, and a bond is formed between a hydrophilized portion of the substrate and the graphene or between an unhydrophobized portion of the substrate and the graphene, wherein the bond is formed between a first functional group that is an amino group formed to (on) the substrate and constituting a part of a silane coupling compound, a self-assembly monomolecule, or a polymer compound and a second functional group that is a hydroxyl group, a carboxyl group, a carbonyl group, or a sulfo group formed (bonded) to the graphene; the substrate is one having a silane bond formed on a surface or one having, on a surface, gold, silver, copper, platinum, palladium, or mercury atoms serving as a metal atom that forms a bond with a thiol group, a sulfide group, or a disulfide group serving as a group having a sulfur atom on the surface; and the first functional group is bonded to the substrate via a molecular chain containing the silane bond or is bonded to the substrate via a molecular chain containing the bond between the group containing a sulfur atom and the metal atom.

The method for producing the graphene structure according to the present disclosure is a technique that can effectively produce the graphene structure according to the present disclosure. The method includes preparing a substrate, applying hydrophilization treatment and/or hydrophobization treatment to the substrate, and disposing (fixing, attaching, or immobilizing) graphene to the hydrophilized portion of the substrate.

The hydrophilization treatment may be conducted by forming a film having hydrophilicity by applying or immobilizing a hydrophilization treatment agent to a portion to be hydrophilized of the substrate or plasma-treating with oxygen ($O_2$) plasma (for example, to form a hydroxyl group on a surface of the substrate). The hydrophobization treatment may be conducted by forming a film having hydrophobicity by applying or immobilizing a hydrophobization treatment agent to a portion to be hydrophobized of the substrate.

In such a case, the film having hydrophilicity is a silane coupling compound film, a self-assembled monolayer (SAM), or a polymer compound film, and the film having hydrophobicity is a silane coupling compound film, a self-assembled monolayer (SAM), a polymer compound film, or a halide film. Furthermore, as the film having hydrophilicity, a film of a compound having an amino group serving as the group containing a nitrogen atom can be used.

Furthermore, the method may include forming a resist (functioning as a hydrophobic polymer compound film) having a predetermined pattern on the substrate, as hydrophobization treatment, before the hydrophilization treatment of the substrate and removing the resist from the hydrophilized substrate. In this case, the hydrophilization treatment may be conducted so that the substrate is hydrophilized at the surface portion exposed from the resist pattern. The removal of the resist may be performed either before or after disposing the graphene on the surface of the substrate.

In the graphene (flake) disposed to the substrate, the molecule may be partially oxidized and be present in a graphene oxide form (in such a case, the term "graphene" refers to a concept including the graphene oxide). In this case, there is a tendency that the conductivity of the graphene disposed to the substrate can be further increased by reducing the graphene (oxide) disposed (fixed) to the substrate. The reduction treatment may be conducted under single conditions or continuously or intermittently under a plurality of conditions.

Furthermore, the method may include forming an electrode connected to the graphene disposed on the substrate.

From the above, the method for producing a graphene structure according to the present disclosure may be represented as a method including preparing a substrate; conducting hydrophilization treatment on a predetermined portion of the substrate by forming a silane coupling compound film, a self-assembled monolayer (SAM), or a polymer compound film as an amino group-containing film having hydrophilicity or by plasma treatment with oxygen ($O_2$) plasma; conducting hydrophobization treatment by forming a resist or halide having a pattern at a predetermined portion of the substrate; disposing graphene on the surface of the substrate exposed from the pattern of the resist or halide; removing the resist or halide from the hydrophilized substrate; reducing the graphene disposed on the surface of the substrate; and forming an electrode connected to the graphene disposed on the surface of the substrate.

Alternatively, the graphene structure according to the present disclosure may be represented as a graphene structure produced by preparing a substrate, subjecting a predetermined portion of the substrate to hydrophilization treatment and/or hydrophobization treatment, disposing (fixing) graphene to the hydrophilized portion of the substrate, and/or disposing (fixing) graphene to the unhydrophobized portion of the substrate.

An electronic device element (including an electronic part element) and an electronic device according to the present disclosure includes a conductor or a semiconductor formed by a graphene structure in which graphene is disposed (fixed) on a substrate, and a bond is formed between a hydrophilized portion of the substrate and the graphene or between an unhydrophobized portion of the substrate and the graphene. Examples of the element or the device include transistors and solar cells (devices) having the graphene structure as a conductive film (layer) or a transparent electrode. In particular, the graphene structure according to the present disclosure is effective as an electrode of a solar cell with a large area and low cost. In addition, the graphene structure is useful for forming, for example, an FET transistor by printing or for the purpose of, for example, a transparent TFT array. Furthermore, the graphene structure can be applied to a highly sensitive magnetic sensor.

DETAILED DESCRIPTION OF THE EXEMPLARY EMBODIMENTS

Figure 1:
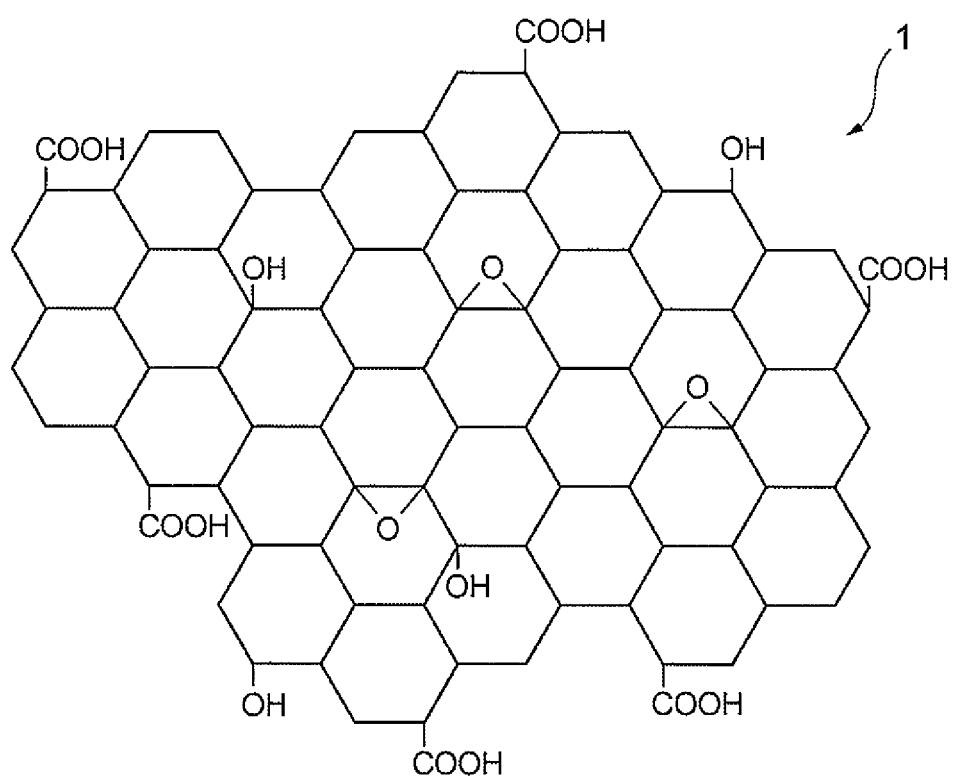
FIG. 1 is a plan view schematically showing a structure of a graphene oxide used for producing a graphene structure according to the present disclosure.

Embodiments of the present disclosure will be described with reference to drawings. In the drawings, the same elements are designated by the same reference numerals, and duplicated description is omitted. The positional relationship, such as left, right, top, and bottom, is based on the positional relationship shown in the drawing, unless specifically stated otherwise. The size ratios of the components are not limited to those illustrated in the drawings. Furthermore, the following embodiments are merely illustrative of the present disclosure, and the present disclosure is not limited to the embodiments. In addition, the present disclosure can be variously modified without departing from the spirit.

FIG. 1 is a plan view schematically showing a structure (molecular structure) of an oxide of graphene (graphene oxide: GO 1) used for producing a graphene structure according to the present disclosure.

The GO 1 can be produced (prepared) from natural graphite powder by a modified Hummer's method (V. C. Tung, M. J. Allen, Y. Yang, et al., Nature Nanotech., 4, 25 (2009)) as follows: First, graphitic oxide (graphite oxide) was produced by oxidizing natural graphite powder (carbon, manufactured by SEC Co., Ltd.); and single-layers of the graphitic oxide were exfoliated by, for instance, ultrasonication (for example, under conditions of a power of 100 W at 60° C. for 1 hour) in water to obtain a GO dispersion aqueous solution in which flakes of GO monolayers were stably dispersed in the water. The GO dispersion aqueous solution was dropwise applied onto a $SiO_2$/Si substrate (Si substrate having $SiO_2$ on a surface thereof), followed by observation with an optical microscope to confirm that the GO flake had a size of about 50 µm×about 50 µm and a thickness of several atomic layers. Furthermore, the present inventors evaluated the GO flake by measuring the actual thickness (the number of the atomic layers) with a Raman spectrometer to confirm the peaks corresponding to GO monolayer and GO multilayer structures, not the graphite, in the Raman shift spectrum. Thus, it was confirmed that monolayered or multilayered GO were significantly present in the resulting GO dispersion aqueous solution. The size and the number of layers of the GO are not limited to the above-mentioned values.

As shown in FIG. 1, a part of carbon atoms constituting the GO 1 may be oxidized or modified with various functional groups (second functional group) having hydrophilicity, such as a hydroxyl group (—OH) or a carboxyl group (—COOH). In particular, many of these functional groups are bonded to carbon atoms on the outermost periphery (edge portion) of the GO 1, and the GO 1 itself shows hydrophilicity due to the chemical properties of these functional groups.

FIGS. 2A to 2E are process charts (top view or plan view) showing an example of a procedure for producing a graphene structure and an electronic device element (or an electronic device) according to the present disclosure by an example of a method for producing a graphene structure according to the present disclosure.

Here, first, a $SiO_2$/Si substrate 10 (a Si substrate having a $SiO_2$ layer purposely or naturally formed on a surface; the $SiO_2$ layer may contain SiO, or a SiO layer may be formed instead of the $SiO_2$ layer) is prepared as the substrate. Then, a resist film 11 having an array of rectangular openings P is patterned on the $SiO_2$/Si substrate 10 by application, such as spin coating, and photolithography (hydrophobization treatment). In the openings P of the resist film 11, the surface of the $SiO_2$/Si substrate 10 is exposed (denuded) (FIG. 2A).

The oxide on the surface of the $SiO_2$/Si substrate 10 tends to form a bond with a hydrogen atom (hydrogen bond: and thus, a hydroxyl group can be formed on the surface) by absorbing moisture in the air. Therefore, it is useful to form a base coat of an adhesion promoter (adhesion-enhancing coating agent) such as hexamethyldisilazane (HMDS) as a primer for applying the resist film 11 on the surface, after the dehydration/drying of the $SiO_2$/Si substrate 10, before the application of the resist film. The adhesion promoter such as HMDS has a function of decreasing surface energy of the $SiO_2$/Si substrate by hydrophobization treatment, and only the adhesion promoter film may be formed, without forming the resist film 11. Furthermore, instead of the resist film 11 and/or the adhesion promoter film, for example, a film (halide film) composed of a fluorine-containing polymer (halide) having a C—F bond, such as polytetrafluoroethylene (PTFE) or a tetrafluoroethylene-hexafluoropropylene copolymer (FEP), can be effectively used for hydrophobization treatment.

Figure 2A:
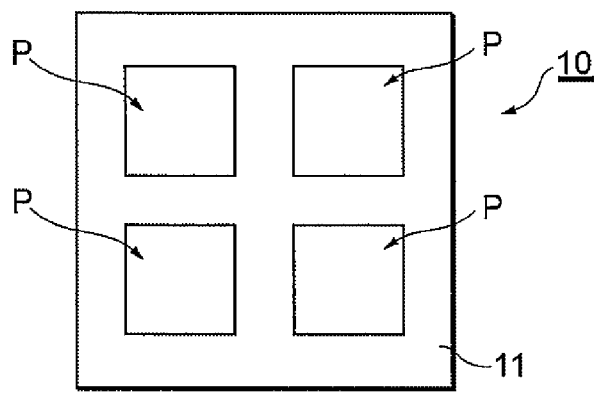
FIG. 2A is a process chart (flow diagram) showing an example of a procedure for producing a graphene structure and an electronic device element (electronic device) according to the present disclosure by an example of a method for producing a grapheme structure according to the present disclosure.
Figure 2B:
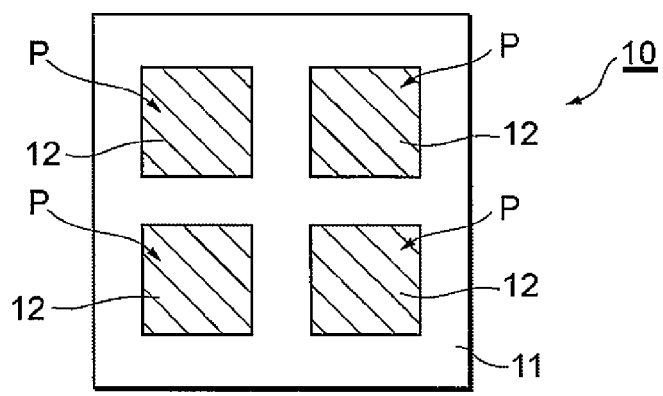
FIG. 2B is a process chart showing the example of the procedure for producing the graphene structure and the electronic device element (electronic device) according to the present disclosure by the example of the method for producing the graphene structure according to the present disclosure.

Then, the surface of the $SiO_2$/Si substrate 10 exposing in the openings P of the resist film 11 is hydrophilized to form hydrophilized films 12 (FIG. 2B). The hydrophilization treatment for this can be performed by various methods.

That is, in an example of the $SiO_2$/Si substrate 10, on the $SiO_2$/Si substrate 10 in a state in which the resist film 11 is formed as shown in FIG. 2A, a silane coupling agent (hydrophilization treatment agent) having an electron acceptor functional group (first functional group) such as an amino group is applied (formation of silane coupling compound film). The type of the silane coupling agent is not particularly limited, but the silane coupling agent is, in a broad sense, a compound constituted of silicon that links an organic substance having the first functional group and an oxide on the $SiO_2$/Si substrate, and specific examples thereof include alkoxysilane having an amino group (aminated silane coupling agent) such as 3-aminopropyltriethoxysilane, 3-aminopropyltrimethoxysilane, 3-(2-aminoethyl) aminopropyltrimethoxysilane, 3-(2-aminomethyl) aminopropyltrimethoxysilane, 3-(2-aminoethyl) aminopropylmethylditrimethoxysilane, and 3-(phenylamino)propyltrimethoxysilane. Furthermore, among these silane coupling agents, those that can form self-assembled monolayers (SAMs) can be used. Note that the silane coupling agents such as the above-mentioned alkoxysilane having an amino group are also understood as one kind of SAM-forming agents.

Furthermore, if a film of a metal such as gold, silver, copper, platinum, palladium, or mercury or a film containing such a metal is formed in advance on the surface of the $SiO_2$/Si substrate 10, the SAM-forming agent (hydrophilization treatment agent) having a thiol group, a sulfide group, a disulfide group, or the like as the group containing a sulfur atom in the molecule and having the above-mentioned first functional group in the same molecule can be applied on the $SiO_2$/Si substrate 10 in a state in which the resist film 11 is formed as shown in FIG. 2A (formation of SAM). Examples of the SAM-forming agent include various thiol, sulfide, and disulfide reagents. In this case, the substrate is not limited to the $SiO_2$/Si substrate 10 and may be a substrate composed of, for example, a metal conductor such as sapphire, GaAs, or stainless steel or an insulator such as glass or ceramics.

The methods for applying the silane coupling agent or the SAM-forming agent are not particularly limited, and examples thereof include a method in which the $SiO_2$/Si substrate 10 in the state shown in FIG. 2A is immersed in a 0.05% solution of the above-mentioned 3-aminopropyltriethoxysilane for about 15 minutes and dip coating. By doing so, one end of the silane coupling agent molecule is bonded on the surface of the $SiO_2$/Si substrate 10 exposing in the openings P of the resist film 11 by silane coupling (silane bond), and an amino group (first functional group) is arranged on the other end of the molecule. Consequently, the surface of the $SiO_2$/Si substrate 10 exposing in the openings P is provided with hydrophilicity. On this occasion, since the resist film 11, the above-described adhesion promoter film, or the halide film has hydrophobicity, the hydrophilization treatment agent and the SAM-forming agent are hardly bonded to these films. Therefore, the surface of the resist film 11 has a tendency not to be hydrophilized.

Alternatively, the surface of the $SiO_2$/Si substrate 10 may be subjected to plasma treatment using, for example, oxygen ($O_2$) plasma in advance. In this case, a hydroxyl group (—OH) serving as the first functional group can be formed on the surface of the $SiO_2$/Si substrate 10.

Figure 2C:
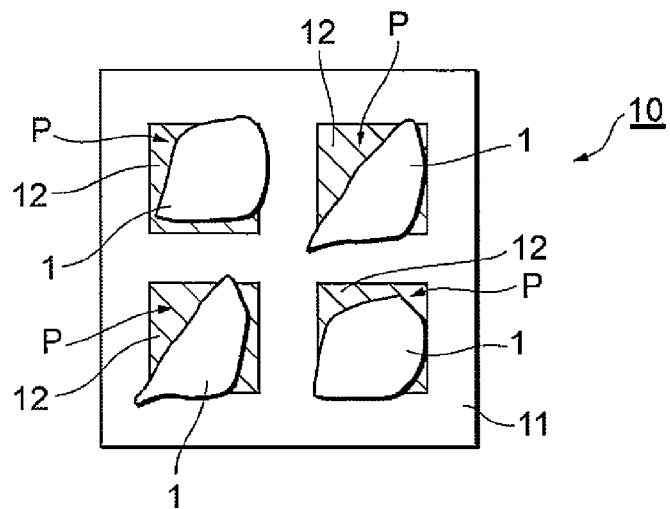
FIG. 2C is a process chart showing the example of the procedure for producing the graphene structure and the electronic device element (electronic device) according to the present disclosure by the example of the method for producing the graphene structure according to the present disclosure.

Then, a separately prepared GO dispersion aqueous solution is applied on the $SiO_2$/Si substrate 10 having the hydrophilized films 12 formed in the openings P of the resist film 11 as shown in FIG. 2B. The method for the application is also not particularly limited, and examples thereof include a method in which the $SiO_2$/Si substrate 10 in the state shown in FIG. 2B is immersed in a GO dispersion aqueous solution containing the GO in an appropriate concentration for a predetermined period of time and dip coating. As a result, a carboxyl group (electron donor functional group, second functional group) bonded to the surface of the GO 1 shown in FIG. 1 shows affinity and bonds to the amino group (electron acceptor functional group, first functional group) on the surface of the $SiO_2$/Si substrate 10 at portions where the hydrophilized films 12 are formed (portions in the openings P of the resist film 11) to selectively fix the GO 1 at the portions in the openings P of the resist film 11 (FIG. 2C). Namely, a bond by the hydrophilization treatment (caused by the hydrophilization treatment) is formed between the $SiO_2$/Si substrate 10 and the GO 1.

Figure 3A:
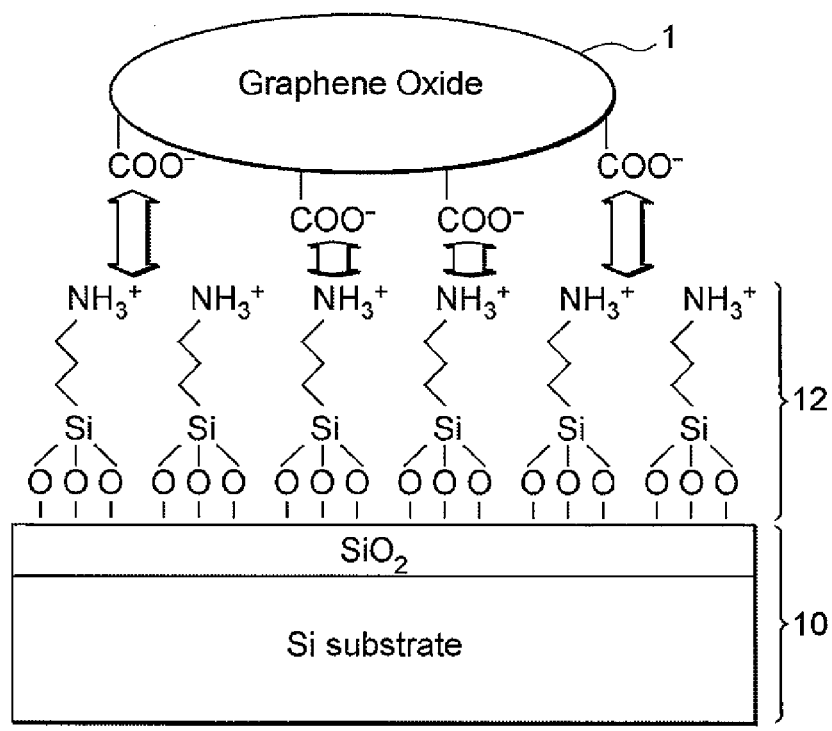
FIG. 3A is a chemically schematized side view of a state in which graphene oxide (GO 1) is fixed on the $SiO_2$/Si substrate 10 shown in FIG. 2B.

Here, FIG. 3A is a chemically schematized side view (or cross-sectional view) of the state in which GO 1 is fixed on the $SiO_2$/Si substrate 10 shown in FIG. 2B. Thus, the GO 1 can be tightly fixed by that the carboxyl group on the surface of the GO 1 is chemically bonded to the amino group on the molecular end of the hydrophilized film 12.

Figure 2D:
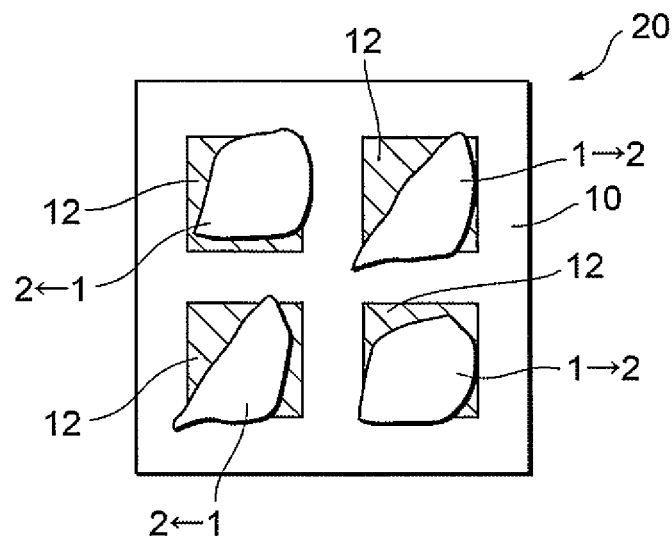
FIG. 2D is a process chart showing the example of the procedure for producing the graphene structure and the electronic device element (electronic device) according to the present disclosure by the example of the method for producing the graphene structure according to the present disclosure.

Then, the resist film 11 is removed from the $SiO_2$/Si substrate 10 in the state in which the GO 1 is selectively fixed in the openings P of the resist film 11 as shown in FIG. 2C by an appropriate method (for example, washing with acetone and water). Subsequently, the $SiO_2$/Si substrate 10 is subjected to reduction treatment for reducing the GO 1 to graphene 2 to obtain a graphene structure 20 in which the graphene 2 is selectively fixed on the $SiO_2$/Si substrate 10 (FIG. 2D). The reduction treatment herein is not particularly limited. For example, the $SiO_2$/Si substrate 10 is left standing in a reducing atmosphere containing hydrazine vapor in a predetermined concentration for a predetermined period of time for vapor-phase reduction, and then the $SiO_2$/Si substrate 10 is heated at a predetermined temperature for a predetermined period of time for reduction by heat. The resist film 11 may be removed before the application of the GO dispersion aqueous solution.

Figure 3B:
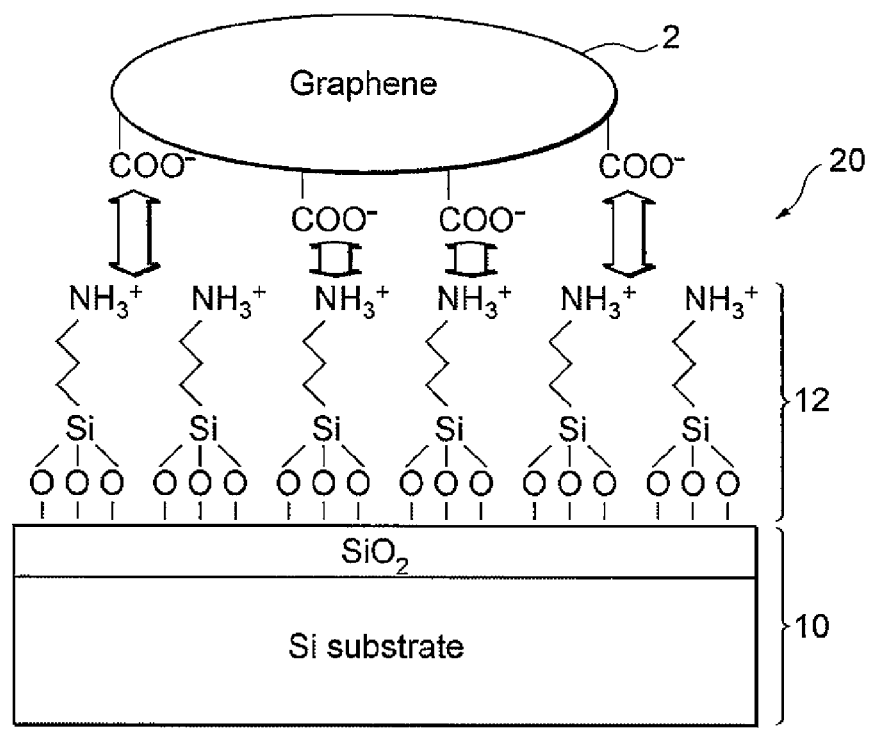
FIG. 3B is a chemically schematized side view of a graphene structure 20 in a state in which graphene 2 is fixed on the $SiO_2$/Si substrate 20 shown in FIG. 2D.

FIG. 3B is a chemically schematized side view (or cross-sectional view) of the graphene structure 20 in a state in which the graphene 2 is fixed on the $SiO_2$/Si substrate 10 shown in FIG. 2D. Thus, by reducing the GO 1 in the state shown in FIG. 3A to the graphene 2, the carboxyl group on the surface of the graphene 2 is chemically bonded to the amino group on the molecular end of the hydrophilized film 12 to maintain the tightly fixed state.

Figure 2E:
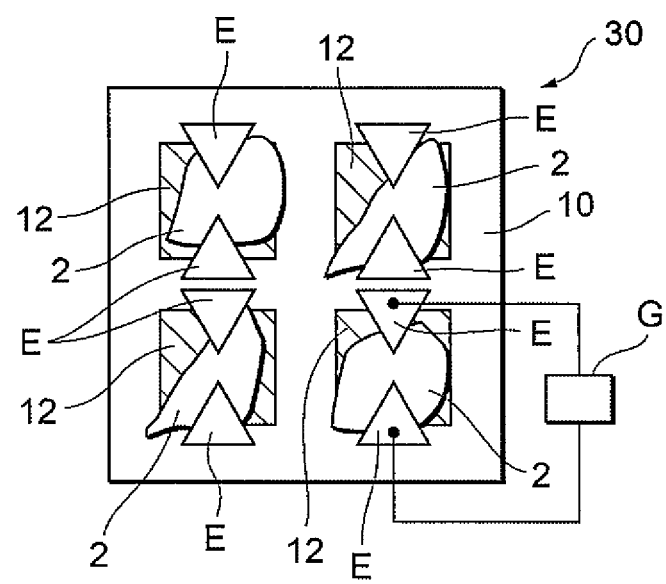
FIG. 2E is a process chart showing the example of the procedure for producing the graphene structure and the electronic device element (electronic device) according to the present disclosure by the example of the method for producing the graphene structure according to the present disclosure.

Then, terminal electrodes E composed of, for example, Ti/Au are formed so as to be connected to the respective graphene 2 on the $SiO_2$/Si substrate 10 in the state in which the graphene 2 is selectively fixed at predetermined portions as shown in FIG. 2D (FIG. 2E: the drawing shows an example in which a pair of terminal electrodes E is formed). By connecting the terminal electrodes E to a power source G, an electronic device 30 in which the graphene 2 functions as a transparent electrode (electronic device element) is realized.

According to the thus constituted graphene structure 20 and the electronic device 30 and also the methods for producing them, since the resist film 11 can be precisely patterned on the $SiO_2$/Si substrate 10 and the hydrophilized films 12 are formed in the openings P of the resist film 11, the patterning precision of the hydrophilized films 12 can be also significantly increased. Furthermore, it is possible to selectively fix GO 1 by chemically bonding it only to the portions where the hydrophilized films 12 are formed by utilizing the fact that the GO 1 has hydrophilicity and then to selectively fix graphene 2 only to the portions of the hydrophilized films 12 by reducing the GO 1. Therefore, the graphene 2 can be patterned on the $SiO_2$/Si substrate 10 with high precision and simply (easily, comfortably). Therefore, microfabrication of an electronic device element (single element of electronic part) such as a transparent electrode employing the graphene 2 and various electronic devices having the electronic device elements is possible, and also the manufacturing cost can be notably reduced.

In addition, since a large-area hydrophilized film 12 can be easily formed on the $SiO_2$/Si substrate 10, the graphene 2 can be selectively and stably fixed thereon. As a result, a film pattern of a large-area graphene 2 with a large-sized domain can be simply formed, though it has been difficult conventionally. Therefore, it is possible to realize, for example, a large-area solar cell at low cost.

Figure 4:
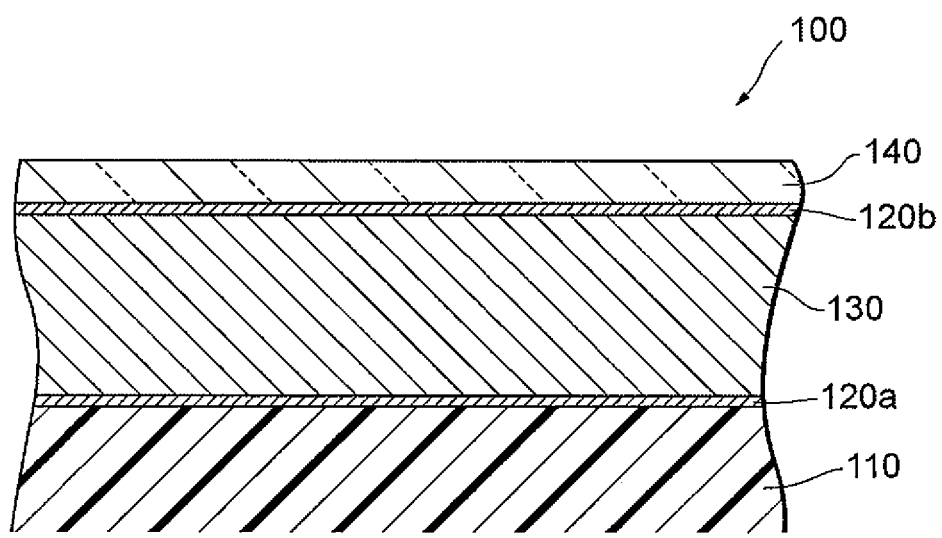
FIG. 4 is a cross-sectional view schematically showing a structure of a solar cell 100 as an example of an electronic device according to the present disclosure.

FIG. 4 is a cross-sectional view schematically showing a structure of a solar cell 100 as an example of the electronic device according to the present disclosure. The solar cell 100 is one in which a solar cell element 130 having a photoelectric effect is formed on a transparent (light-transmitting) electrode 120a of a film made of, for example, the above-described graphene 2 formed on a substrate 110 composed of, for example, a metal conductor such as stainless steel or an insulator such as ceramics, and a transparent electrode 120b of a film made of, for example, the above-described graphene 2 is further formed on the solar cell element 130, and the entire is covered with a protector 140 composed of, for example, a light-transmitting resin. The solar cell 100 may have an integrated configuration in which a plurality of elements of the transparent electrodes 120a and 120b and the solar cell element 130 are separately formed on the same layer and are connected to one another in series. Note that the substrate 110 and the transparent electrode 120a formed thereon and the solar cell element 130 and the transparent electrode 120b formed thereon correspond to the graphene structure and the electronic device element according to the present disclosure.

The transparent electrode 120a of the solar cell 100 can be formed easily and in a large area by, for example, reducing the GO 1 selectively bonded on the hydrophilized film 12 formed in a predetermined portion on the substrate 110, as in the formation of the above-described graphene structure 20. In addition, the transparent electrode 120b can be formed easily and in a large area by reducing the GO 1 selectively bonded on the hydrophilized film 12 formed in a predetermined portion on the solar cell element 130, as in the formation of the transparent electrode 120a on the substrate 110.

The solar cell element 130 is not particularly limited as long as it has a photoelectric effect, and various known ones such as silicon-based, compound semiconductor-based, and organic semiconductor-based elements, wet-type (liquid, liquid-like body, and fluid) elements, and those obtained by dye-sensitizing them, can be used. The solid-based elements include crystalline and amorphous ones, and the crystalline elements are known to be classified to single-crystalline and polycrystalline ones. In the drawing, a solid-based solar cell element 130 is particularly shown as an example.

As described above, the present disclosure is not limited to the above-described embodiments and can be variously modified, without departing from the spirit, as appropriately described in above. In the embodiments, among the above-described cases of (1) applying only hydrophilization treatment to a predetermined portion of a substrate, (2) applying only hydrophobization treatment to a predetermined portion of a substrate, and (3) applying hydrophilization treatment to a predetermined portion of a substrate and applying hydrophobization treatment to a predetermined portion of the substrate, an aspect corresponding to the case (3) has been described, but the aspect of the case (1) or (2) may be employed. That is, in the aspect of the case (1), only a film having hydrophilicity such as the hydrophilized film 12 may be formed by patterning (hydrophilization treatment) using, for example, an appropriate mask (reticle), without forming a film having hydrophobicity (hydrophobization treatment) such as the resist film 11, and in the aspect of the case (2), only a film having hydrophobicity such as the resist film 11 may be formed by patterning, without forming a film having hydrophilicity (hydrophilization treatment) such as the hydrophilized film 12. In these cases, the selectivity of bonding and fixing the GO 1 is increased in the order (1)<(2)<(3), as described above.

As described above, the graphene structure, the method for producing the graphene structure, the electronic device element, and the electronic device of the present disclosure can be widely and effectively used in, for example, a large-area solar cell at low cost, an FET transistor, a transparent TFT array, and a highly sensitive magnetic sensor in electronic devices, apparatuses, instruments, systems, facilities, and so on that are used in various fields of, for example, electronic engineering, electrical engineering, material analysis, optical communication, wireless communication, and wire communication.

What is claimed is:

1. A method for producing a graphene structure, the method comprising:
   preparing a substrate;
   conducting a hydrophilization treatment on a predetermined portion of the substrate by plasma treatment with oxygen ($O_2$) plasma;
   conducting a base coating treatment comprising an adhesion agent on a surface of the substrate, wherein the adhesion agent is selectively disposed in a pattern at a predetermined portion of the substrate between the surface of the substrate and a hydrophobization treatment;
   conducting the hydrophobization treatment by forming a resist or a halide having the pattern at the predetermined portion of the substrate;
   disposing graphene on the surface of the substrate exposed from the pattern of the resist or halide;
   removing the resist or the halide from the hydrophilized substrate;
   reducing the graphene disposed on the surface of the substrate; and
   forming an electrode connected to the graphene disposed on the surface of the substrate.

2. A method for producing a graphene structure, the method comprising:
   preparing a substrate comprising silicon coated by silicon dioxide ($SiO_2$);
   subjecting a predetermined portion of the substrate to a base coating treatment comprising an adhesion agent and a hydrophobization treatment, wherein the adhesion agent is selectively disposed in a predetermined pattern between a surface of the substrate and the hydrophobization treatment; and
   disposing graphene to an unhydrophobized portion of the substrate.

3. The method for producing the graphene structure according to claim 2, wherein the hydrophobization treatment is performed by forming a film having hydrophobicity by applying or immobilizing a hydrophobization treatment agent to the predetermined portion the substrate.

4. The method for producing the graphene structure according to claim 3, wherein the film having hydrophobicity is a silane coupling compound film, a self-assembled monolayer, a polymer compound film, or a halide film.

5. A method for producing a graphene structure, the method comprising:
   preparing a substrate;
   subjecting a predetermined portion of the substrate to a base coating treatment comprising an adhesion agent and a hydrophobization treatment, the hydrophobization treatment comprising forming a resist or a halide having a predetermined pattern on the substrate before hydrophilization treatment of the substrate, wherein the adhesion agent is selectively disposed based on the predetermined pattern between a surface of the substrate and the hydrophobization treatment;
   subjecting the substrate to the hydrophilization treatment by plasma treatment with oxygen ($O_2$) plasma;
   removing the resist or the halide from the hydrophilized substrate; and
   disposing graphene to the hydrophilized portion of the substrate,
   wherein the hydrophilization treatment is performed so as to hydrophilize the surface of the substrate exposed from the resist or the halide pattern.

6. The method for producing the graphene structure according to claim 2, the method comprising:
   reducing the graphene disposed to the substrate.

7. The method for producing the graphene structure according to claim 2, the method comprising:
   forming an electrode connected to the graphene disposed to the substrate.

8. The method for producing the graphene structure according to claim 3, wherein the film having hydrophilicity contains an amino group serving as a group containing a nitrogen atom.

* * * * *

UNITED STATES PATENT AND TRADEMARK OFFICE
CERTIFICATE OF CORRECTION

| | | |
|---|---|---|
| PATENT NO. | : 9,607,725 B2 | Page 1 of 1 |
| APPLICATION NO. | : 12/643434 | |
| DATED | : March 28, 2017 | |
| INVENTOR(S) | : Sandhu | |

It is certified that error appears in the above-identified patent and that said Letters Patent is hereby corrected as shown below:

In the Specification

In Column 6, Line 5, delete "grapheme" and insert -- graphene --, therefor.

In the Claims

In Column 11, Line 39, in Claim 1, delete "graphene" and insert -- the graphene --, therefor.

In Column 11, Line 40, in Claim 1, delete "halide;" and insert -- the halide; --, therefor.

Signed and Sealed this
Sixteenth Day of May, 2017

Michelle K. Lee
*Director of the United States Patent and Trademark Office*